(12) United States Patent
Kim et al.

(10) Patent No.: US 7,898,834 B2
(45) Date of Patent: Mar. 1, 2011

(54) SEMICONDUCTOR CHIP WITH CHIP SELECTION STRUCTURE AND STACKED SEMICONDUCTOR PACKAGE HAVING THE SAME

(75) Inventors: Sung Min Kim, Seoul (KR); Chang Jun Park, Kyeonggi-do (KR); Kwon Whan Han, Seoul (KR); Seong Cheol Kim, Gyeongsangnam-do (KR); Ha Na Lee, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 256 days.

(21) Appl. No.: 12/059,308

(22) Filed: Mar. 31, 2008

(65) Prior Publication Data
US 2009/0189267 A1 Jul. 30, 2009

(30) Foreign Application Priority Data
Jan. 25, 2008 (KR) .................. 10-2008-0008252

(51) Int. Cl.
*G11C 5/02* (2006.01)
(52) U.S. Cl. .............................. 365/51; 365/52; 257/687
(58) Field of Classification Search .................... 365/51, 365/52; 257/678
See application file for complete search history.

(56) References Cited

U.S. PATENT DOCUMENTS

| 6,392,292 | B1 | 5/2002 | Morishita | |
|---|---|---|---|---|
| 2003/0006490 | A1* | 1/2003 | Kawaishi | 257/678 |
| 2005/0162950 | A1* | 7/2005 | Koide | 365/201 |
| 2009/0121336 | A1* | 5/2009 | Kim | 257/686 |

FOREIGN PATENT DOCUMENTS

| JP | 2005-285997 A | 10/2005 |
|---|---|---|
| JP | 2007-012848 A | 1/2007 |

* cited by examiner

*Primary Examiner* — Huan Hoang
(74) *Attorney, Agent, or Firm* — Ladas & Parry LLP

(57) ABSTRACT

A semiconductor chip with a chip selection structure suitable for a stacked semiconductor chip includes a semiconductor chip body and a chip selection structure. The chip selection structure includes a chip selection pad disposed over the semiconductor chip body, a main through electrode electrically connected to the chip selection pad, and a sub through electrode interposed between the main through electrode and the chip selection pad. A plurality of the semiconductor chips, each having the same chip selection structure, can be stacked by offsetting the stacked semiconductor chips.

23 Claims, 7 Drawing Sheets

SEMICONDUCTOR CHIP WITH CHIP SELECTION STRUCTURE AND STACKED SEMICONDUCTOR PACKAGE HAVING THE SAME

CROSS-REFERENCE TO RELATED APPLICATIONS

The present application claims priority to Korean patent application number 10-2008-0008252 filed on Jan. 25, 2008, which is incorporated herein by reference in its entirety.

BACKGROUND OF THE INVENTION

The present invention relates to a semiconductor chip and a stacked semiconductor package having the same, and more particularly to a semiconductor chip having a chip selecting structure and a stacked semiconductor package having the same.

Recent developments in semiconductor fabrication technology have lead to various types of semiconductor packages having semiconductor devices suitable for processing more data in shorter periods of time.

One of these developments is a stacked semiconductor package, in which semiconductor chips are stacked and connected to each other. The stacked semiconductor package improves both data storage capacity and data processing speed.

In order to realize the stacked semiconductor package, a control signal, a data signal, a power signal, and an address signal are applied to a specific semiconductor chip among the plurality of stacked semiconductor chips. However, difficulties ensue, in that different patterns or through holes must be formed in different positions in the respective semiconductor chips of the stacked semiconductor package in order to select the corresponding specific semiconductor chip of the plurality of stacked semiconductor ships.

SUMMARY OF THE INVENTION

Embodiments of the present invention are directed to a semiconductor chip having a chip selection structure suitable for a stacked semiconductor package.

Additionally, embodiments of the present invention are directed to a semiconductor package which includes the semiconductor chip.

In one embodiment, a semiconductor chip having a semiconductor chip body comprises a chip selection structure having a chip selection pad disposed over the semiconductor chip body, a main through electrode electrically connected with the chip selection pad, and a sub through electrode interposed between the main through electrode and the chip selection pad.

The chip selection pad, the sub through electrode, and the main through electrode are disposed in a straight line.

The chip selection pad is disposed adjacent to an edge of the semiconductor chip body, and the chip selection pad, the sub through electrode, and the main through electrode are aligned in a direction that is substantially perpendicular to the edge of the semiconductor chip body.

The semiconductor chip may further comprise connection members disposed at ends of the main through electrode and the sub through electrode.

The chip selection pad and the main through electrode are electrically connected to each other by a chip selection redistribution disposed over the semiconductor chip body.

The main through electrode may alternatively pass through the chip selection pad.

The semiconductor chip may further comprise a data pad structure disposed along an edge of the semiconductor chip body and having a data pad, a first data through electrode electrically connected with the data pad, and a second data through electrode electrically connected to the first data through electrode.

The first data through electrode may pass through the data pad.

The data pad structure may be disposed parallel to the chip selection structure.

A distance between the main through electrode and the sub through electrode is substantially the same as a distance between the first data through electrode and the second data through electrode.

The semiconductor chip may further comprise connection members disposed at ends of the first and second data through electrodes.

The data pad, the first data through electrode and the second data through electrode are electrically connected by a data redistribution disposed over the semiconductor chip body.

In another embodiment, a semiconductor chip having a semiconductor chip body comprises a first chip selection structure having a first chip selection pad disposed over the semiconductor chip body, a first main through electrode electrically connected to the first chip selection pad, a first sub through electrode interposed between the first main through electrode and the first chip selection pad, and a second sub through electrode disposed outside of the first main through electrode; and a second chip selection structure having third and fourth sub through electrodes disposed adjacent to the first chip selection pad over the semiconductor chip body, second and third main through electrodes disposed outside of the third and fourth sub through electrodes, and a second chip selection pad disposed outside of the second and third main through electrodes and electrically connected to the second and third main through electrodes.

Distances between the first main through electrode and the first sub through electrode, and the first main through electrode and the second sub through electrode are substantially the same as distances between the second and third main through electrodes, the second main through electrode and the fourth sub through electrode, and the third and fourth sub through electrodes.

The first chip selection structure and the second chip selection chip structure may be disposed parallel to each other.

Alternatively, the first chip selection structure and the second chip selection chip structure are disposed serially with respect to an edge of the semiconductor chip body.

The semiconductor chip may further comprise a first chip selection redistribution for electrically connecting the first chip selection pad to the first main through electrode.

The semiconductor chip may further comprise a second chip selection redistribution for electrically connecting the second chip selection pad to the second and third main through electrodes.

The semiconductor chip may further comprise connection members disposed at ends of the first main through electrode, the first and second sub through electrodes, the second and third main through electrodes, and the third and fourth sub through electrodes.

The semiconductor chip may further comprise a data pad structure disposed over the semiconductor chip body and having a data pad, a first data through electrode electrically connected to the data pad, and a second data through electrode electrically connected to the first data through electrode.

In further another embodiment, a stacked semiconductor package comprises a first semiconductor chip having a first chip selection pad disposed over a first semiconductor chip body, a first main through electrode electrically connected to the first chip selection pad, and a first sub through electrode interposed between the first main through electrode and the first chip selection pad; and a second semiconductor chip having a second chip selection pad disposed over a second semiconductor chip body, a second main through electrode electrically connected to the second chip selection pad, and a second sub through electrode interposed between the second main through electrode and the second chip selection pad, wherein the second semiconductor chip is disposed over the first semiconductor chip, and the first and second semiconductor chips are offset, and thus the first sub through electrode is electrically connected to the second main through electrode.

The stacked semiconductor package may further comprise a connection member for electrically connecting the first sub through electrode to the second main through electrode.

DESCRIPTION OF SPECIFIC EMBODIMENTS

Figure 1:
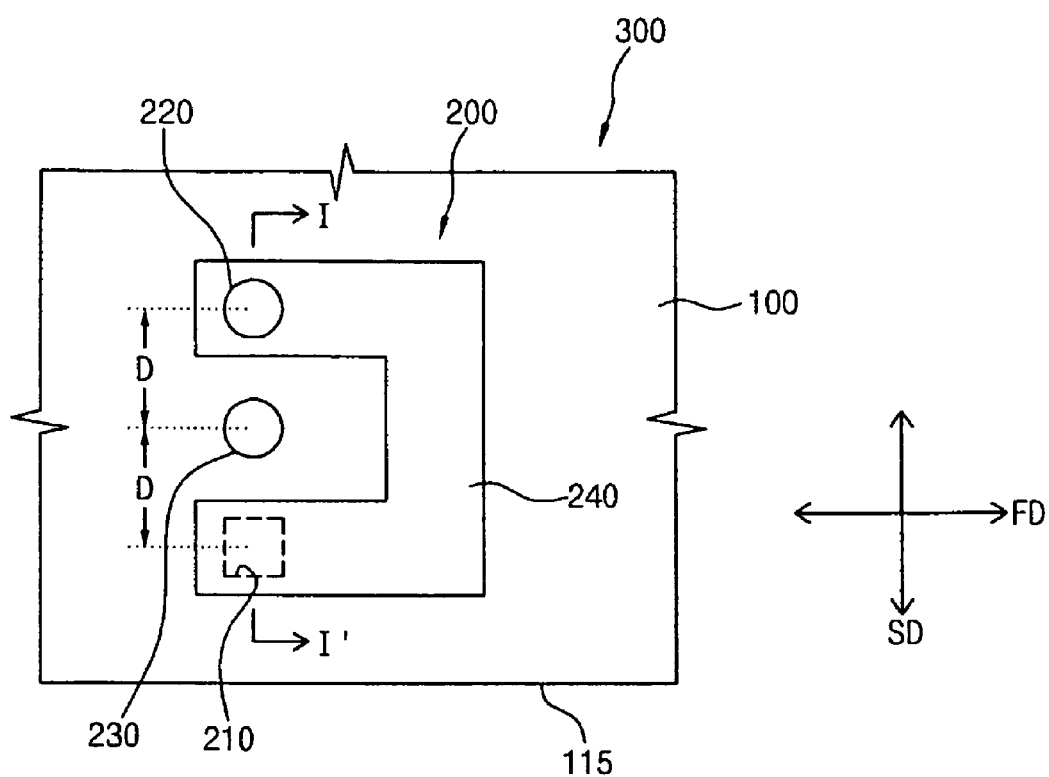
FIG. 1 is a plan view showing a semiconductor chip in accordance with an embodiment of the present invention.
Figure 2:
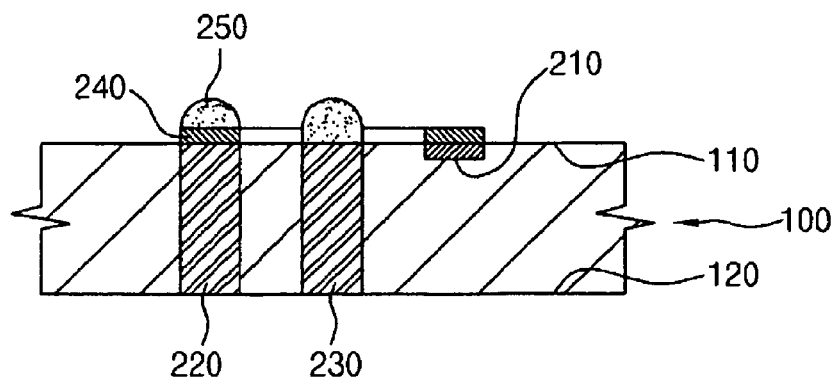
FIG. 2 is a cross-sectional view taken along line I-I' of FIG. 1.

FIG. 1 is a plan view showing a semiconductor chip in accordance with an embodiment of the present invention. FIG. 2 is a cross-sectional view taken along line I-I' of FIG. 1.

Referring to FIGS. 1 and 2, a semiconductor chip 300 includes a semiconductor chip body 100 and a chip selection structure 200.

The semiconductor chip body 100 has, e.g., a rectangular parallelepiped shape and includes a circuit part (not shown). The circuit part may include a data storage part (not shown) for storing data and a data processing part (not shown) for processing the data. In FIG. 1, reference numeral 115 indicates an edge of the semiconductor chip body 100.

The semiconductor chip body 100 having a rectangular parallelepiped shape includes a first surface 110 and a second surface 120 opposite to the first surface 110 as shown in FIG. 2.

The chip selection structure 200 includes a chip selection pad 210, a main through electrode 220, and a sub through electrode 230. In addition, the chip selection structure 200 includes a chip selection redistribution 240.

The chip selection pad 210 is, for example, disposed over the upper surface 110 of the semiconductor chip body 100. Specifically, the chip selection pad 210 is electrically connected to the circuit part of the semiconductor chip and is disposed adjacent to the edge 115 of the upper surface 110.

The main through electrode 220 is disposed adjacent to the chip selection pad 210. When viewed from the top of the semiconductor chip 300, the main through electrode 220 is disposed in a second direction SD of FIG. 1 with respect to the chip selection pad 210, such that the chip selection pad 210 and the main through electrode 220 are disposed in a substantially straight line.

The main through electrode 220 passes through the upper surface 110 and the lower surface 120 of the semiconductor chip body 100. Examples of material suitable for the main through electrode 220 include copper and the like. Additionally, the main through electrode 220 may include a seed metal layer (not shown) formed over the surface of the main through electrode 220.

In the present embodiment, the main through electrode 220 is electrically connected to the chip selection pad 210. The main through electrode 220 and the chip selection pad 210 are electrically connected by, e.g., the chip selection redistribution 240 disposed over the first surface 110 of the semiconductor chip body 100. Examples of material suitable for the chip selection redistribution 240 include copper and the like.

Although the main through electrode 220 and the chip selection pad 210 are electrically connected using the chip selection redistribution 240; alternatively, the main through electrode 220 may pass through the chip selection pad 210. Referring again to FIG. 1, the sub through electrode 230 is disposed, e.g., between the chip selection pad 210 and the main through electrode 220.

In the present embodiment, the chip selection pad 210, the sub through electrode 230, and the main through electrode 220 are disposed in the second direction SD of FIG. 1 when viewed from the top of the semiconductor chip, such that the chip selection pad 210, the sub through electrode 230, and the main through electrode 220 are disposed, e.g., in a substantially straight line.

Accordingly, the chip selection structure 200 having the chip selection pad 210, the sub through electrode 230, and the main through electrode 220 (which are described above) is disposed, e.g., in a direction that is substantially perpendicular to the edge 115 of the first surface 110.

In the present embodiment, the chip selection pad 210 and the main through electrode 230 are spaced at substantially the same distance D from the sub through electrode 230.

Referring again to FIG. 2, in order to stack a plurality of the semiconductor chips 300 shown in FIG. 1 and to electrically connect each of the semiconductor chips 300 of the stack, connection members 250 may be disposed at ends of the main through electrode 220 and the sub through electrode 230 of the chip selection structure 200, each of which are exposed from the first surface 110 of the semiconductor chip body 100. The connection member 250 may include a solder having a melting temperature lower than those of the main through electrode 220 and the sub through electrode 230. Alternatively, the connection member 250 may include various low melting point metals other than the solder.

Figure 3:
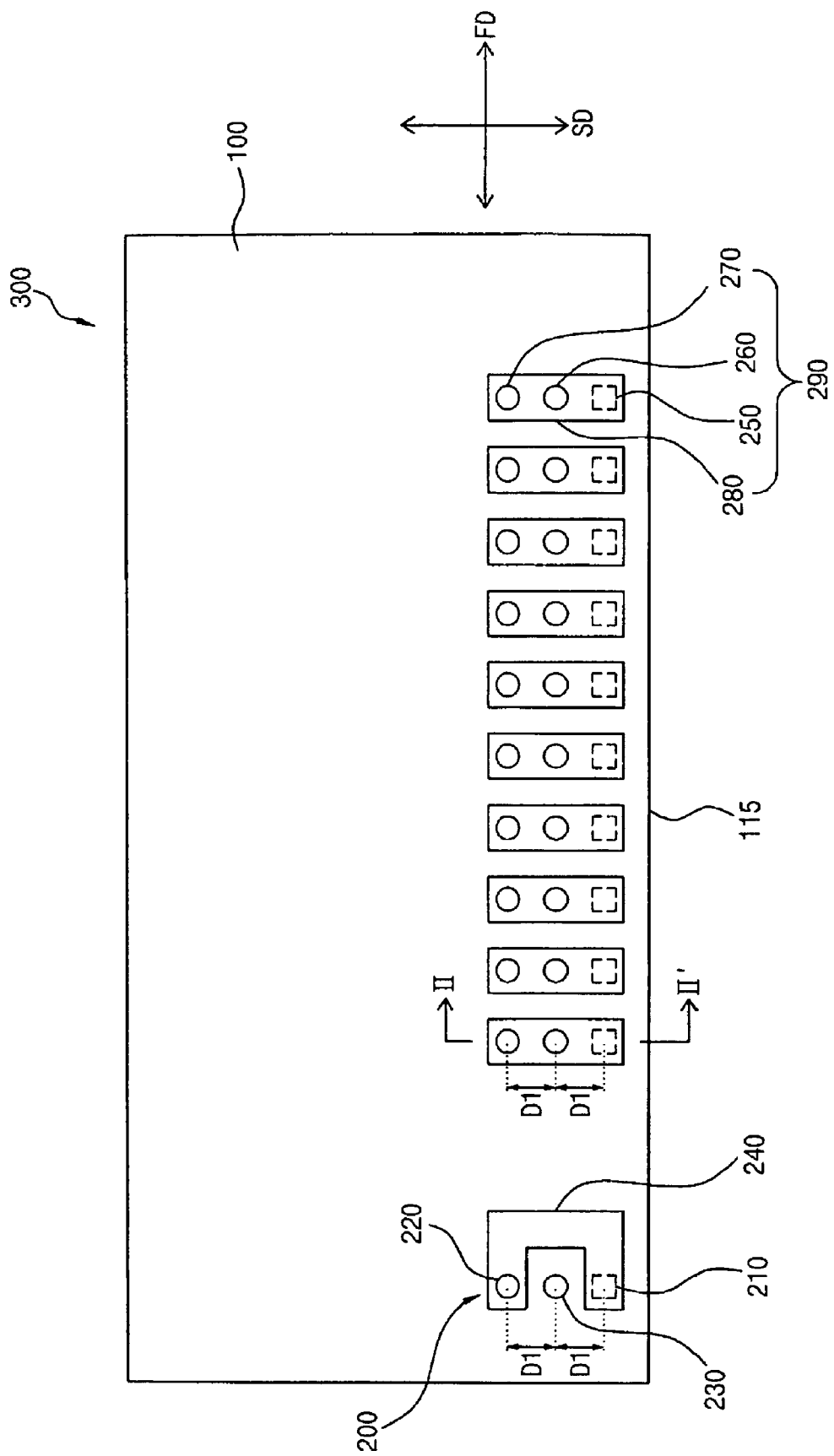
FIG. 3 is a plan view showing a semiconductor chip having a data pad structure in accordance with an embodiment of the present invention.
Figure 4:
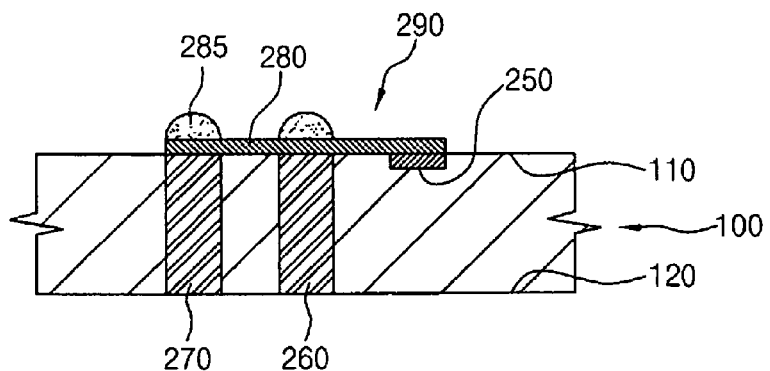
FIG. 4 is a cross-sectional view taken along line II-II' of FIG. 3.

FIG. 3 is a plan view showing a semiconductor chip having a data pad structure in accordance with an embodiment of the present invention. FIG. 4 is a cross-sectional view taken along line II-II' of FIG. 3.

Referring to FIGS. 3 and 4, the semiconductor chip 300 includes a data pad structure 290 in addition to the semiconductor chip body 100 and the chip selection structure 200 shown in FIGS. 1 and 2.

The semiconductor chip 300 shown in FIG. 3 includes a plurality of the data pad structures 290, and each data pad structure 290 includes a data pad 250, a first data through electrode 260, and a second data through electrode 270. In addition, the data pad structure 290 includes a data redistribution 280.

In the semiconductor chip 300, an address signal, a power signal, a data signal, and a control signal are applied to the data pad 250 of the data pad structure 290.

In the present embodiment, the plurality of data pad structures 290 is disposed along the edge 115 of the first surface 110 of the semiconductor chip body 100.

Respective data pads 250 of the data pad structures 290 are disposed along the edge 115 of the first surface 110 of the semiconductor chip body 100, and the data pad 250 is electrically connected to the circuit part of the semiconductor chip. In the present embodiment, the data pads 250 and the chip selection pad 210 are disposed in a substantially straight line in the first direction FD when viewed from the top of the semiconductor chip 300 as shown in FIG. 3.

The first data through electrode 260 is disposed at a predetermined distance from the data pad 250. The first data through electrode 260 passes through the first surface 110 and the second surface 120 of the semiconductor chip body 100. In the present embodiment, the first data through electrodes 260 and the sub through electrode 230 are disposed in a substantially straight line in the first direction FD when viewed from the top of the semiconductor chip.

Therefore, the distance between the data pad 250 and the first data through electrode 260 is substantially the same as the distance D between the chip selection pad 210 and the sub through electrode 230. Also, a connection member 285, such as a solder, may be disposed at the end of the first data through electrode 260, which is exposed from the first surface 110 of the semiconductor chip body 100. In the present embodiment, the connection member 285, which is connected to the first data through electrode 260, may also include various low melting point metals other than solder.

The second data through electrode 270 is disposed at a predetermined distance from the first data through electrode 260. The second data through electrode 270 passes through the first surface 110 and the second surface 120 of the semiconductor chip body 100. In the present embodiment, the second data through electrodes 270 and the main through electrode 220 are disposed in a straight line in the first direction FD when viewed from the top of the semiconductor chip. Therefore, a distance between the first data through electrode 260 and the second data through electrode 270 is substantially the same as the distance D between the sub through electrode 230 and the main through electrode 220.

A connection member 285 such as a solder may be disposed at the end of the second data through electrode 270, which is exposed from the first surface 110 of the semiconductor chip body 100. In the present embodiment, the connection member 285, which is connected to the second data through electrode 270, may include various low melting point metals other than solder.

In the present embodiment, the data pad structure 290, which includes the data pad 250, the first data through electrode 260, and the second data through electrode 270, is disposed parallel to the chip selection structure 200.

The data redistribution 280 is disposed over the first surface 110 of the semiconductor chip body 100. The data redistribution 280 electrically connects the data pad 250, the first data through electrode 260, and the second data through electrode 270. Examples of material suitable for the data redistribution 280 include copper and the like.

Although the first and the second data through electrodes 260 and 270 are electrically connected using the data redistribution 280; alternatively, the second data through electrode 270 may pass through the data pad 250 in order to electrically connect the data pad 250 and the second data through electrode 270.

As described above in detail, the chip selection structure 200, which has the main through electrode 220 electrically connected to the chip selection pad 210 and the sub through electrode 230 disposed adjacent to the main through electrode 220, can be applied to various stacked semiconductor packages in which at least two semiconductor chips are stacked on each other.

Figure 5:
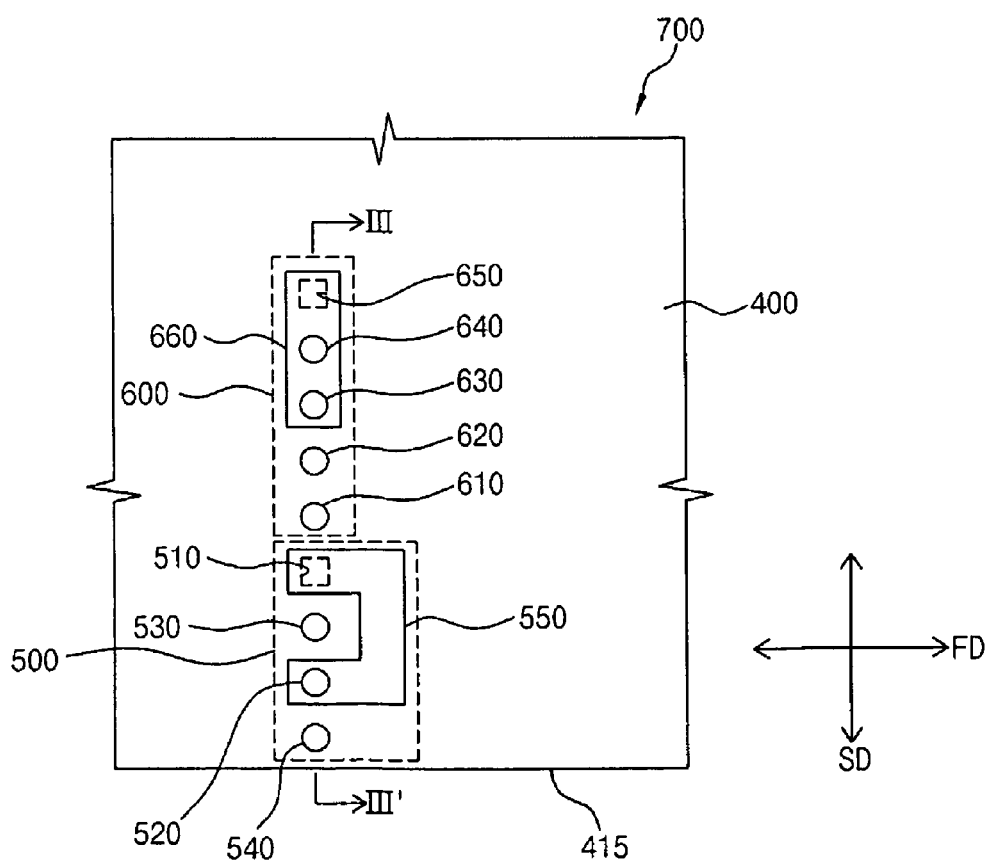
FIG. 5 is a plan view showing a semiconductor chip in accordance with another embodiment of the present invention.
Figure 6:
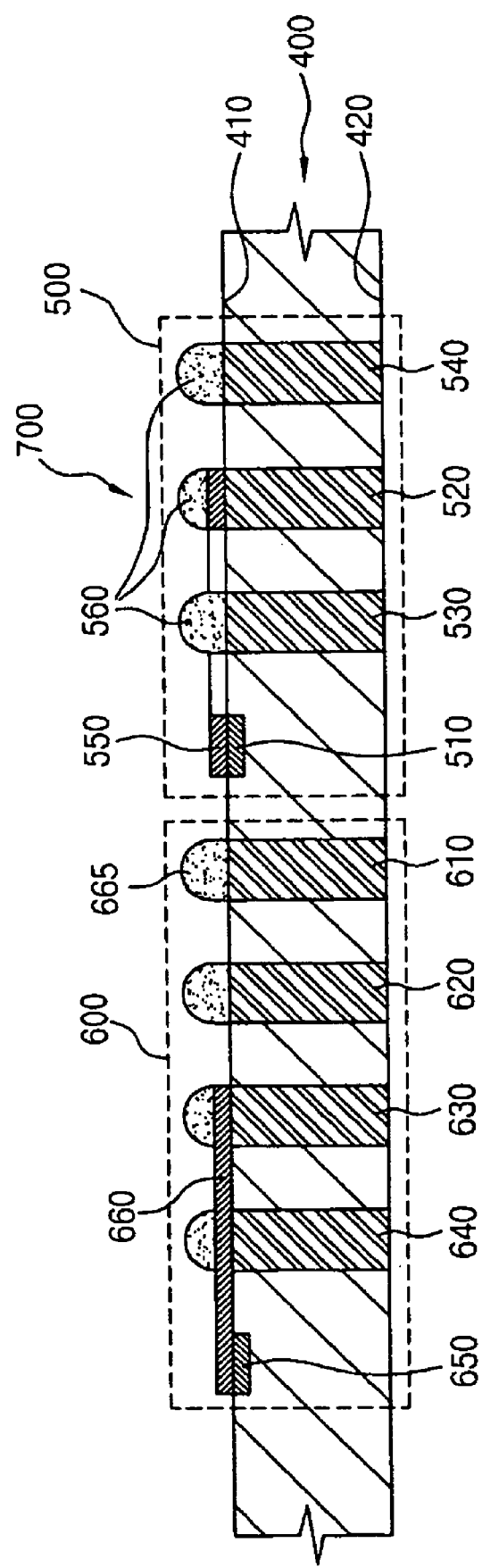
FIG. 6 is a cross-sectional view taken along line III-III' of FIG. 5.

FIG. 5 is a plan view showing a semiconductor chip in accordance with an embodiment of the present invention. FIG. 6 is a cross-sectional view taken along line III-III' of FIG. 5.

Referring to FIGS. 5 and 6, a semiconductor chip 700 includes a semiconductor chip body 400, a first chip selection structure 500, and a second chip selection structure 600.

The semiconductor chip body 400 may, e.g., have a rectangular parallelepiped shape and includes a circuit part (not shown) having a data storage part (not shown) and a data processing part (not shown). The data storage part stores data and the data processing part processes the data stored in the data storage part.

The semiconductor chip body 400 having the rectangular parallelepiped shape includes a first surface 410 and a second surface 420 opposite to the first surface 410 as shown in FIG. 6. In FIG. 5, reference numeral 415 indicates an edge of the semiconductor chip body 400.

The first chip selection structure 500 includes a first chip selection pad 510, a first main through electrode 520, a first sub through electrode 530, and a second sub through electrode 540. In addition, the first chip selection structure 500 includes a first chip selection redistribution 550.

The first chip selection pad 510 is, for example, disposed over the first surface 410 of the semiconductor chip body 400 and is electrically connected to the circuit part of the semiconductor chip 700.

The first main through electrode 520 is disposed adjacent to the first chip selection pad 510, and the first main through electrode 520 and the first chip selection pad 510 are separated by a predetermined distance. The first main through electrode 520 is disposed in a second direction SD of FIG. 5 with respect to the first chip selection pad 510 when viewed from the top of the semiconductor chip 700, such that the first chip selection pad 510 and the first main through electrode 520 are disposed in a substantially straight line.

In the present embodiment shown in FIG. 5, the first main through electrode 520 is disposed closer to the edge 415 of the first surface 410 of the first semiconductor chip body 400 than the first chip selection pad 510. Alternatively, the position of first main through electrode 520 and the position of the first chip selection pad 510 may be switched.

The first main through electrode 520 passes through the upper surface 410 and the lower surface 420 of the first semiconductor chip body 400. Examples of material suitable for the first main through electrode 520 includes copper and the like. The first main through electrode 520 may also include a seed metal layer (not shown) formed over the surface of the first main through electrode 520.

In the present embodiment, the first main through electrode 520 is electrically connected to the first chip selection pad 510. The first main through electrode 520 and the first chip selection pad 510 are electrically connected by, e.g., a first chip selection redistribution 250 disposed over the first surface 410 of the first semiconductor chip body 400. Examples of suitable material for the first chip selection redistribution 550 includes copper and the like.

Although in FIGS. 5-6 the first main through electrode 520 and the first chip selection pad 510 are at a predetermined distance from each other, and the first main through electrode 520 and the first chip selection pad 510 are electrically connected using the first chip selection redistribution 550 in the present embodiment, the first main through electrode 520 may alternatively pass through the first chip selection pad 510 such that the first main through electrode 520 and the first chip selection pad 510 are electrically connected.

Referring again to FIG. 5, the first sub through electrode 530 is disposed, e.g., between the first chip selection pad 510 and the first main through electrode 520. The first sub through electrode 530 passes through the first surface 410 and the second surface 420 of the first semiconductor chip body 400.

The second sub through electrode 540 is interposed between the edge 411 of the first surface 410 of the first semiconductor chip body 400 and the first main through electrode 520. The second sub through electrode 540 passes through the first surface 410 and the second surface 420 of the first semiconductor chip body 400.

In the present embodiment, the second sub through electrode 540, the first chip selection pad 510, the first sub through electrode 530, and the first main through electrode 520 are disposed in the second direction SD of FIG. 5 when viewed from the top of the semiconductor chip.

Accordingly, the second sub through electrode 540, the first chip selection pad 510, the first sub through electrode 530, and the first main through electrode 520 are disposed, e.g., in a substantially straight line.

Thus, the first chip selection structure 500, which has the first chip selection pad 510, the first and second sub through electrodes 530 and 540, and the first main through electrode 520 described above, is disposed, e.g., in the second direction SD substantially perpendicular to the edge 415 of the first surface 410.

In the present embodiment, the distance between the second sub through electrode 540 and the first main through electrode 520, the distance between the first main through electrode 520 and the first sub through electrode 530, and the distance between the first sub through electrode 530 and the first chip selection pad 510 may be substantially the same.

Referring to FIG. 6, connection members 560 are respectively disposed at ends of the first main through electrode 520 and the first and second sub through electrodes 530 and 540 of the first chip selection structure 500. As shown in FIG. 6, the ends, which have the connection members 560 formed thereon, are exposed from the first surface 410 of the first semiconductor chip body 400.

The connection member 560 may include a solder having a melting temperature lower than the melting temperatures of the first main through electrode 520 and the first and second sub through electrodes 530 and 540. Alternatively, the connection member 560 may include various metals other than solder that have a low melting temperature.

Referring again to FIGS. 5 and 6, the second chip selection structure 600 includes a third sub through electrode 610, a fourth sub through electrode 620, a second main through electrode 630, a third main through electrode 640, and a second chip selection pad 650.

The second chip selection structure 600 and the aforementioned first chip selection structure 500 may be disposed serially with respect to the edge 415 of the first surface 410 of the semiconductor chip body 400. Although in the present embodiment shown in FIGS. 5-6, the second chip selection structure 600 and the first chip selection structure 500 are serially disposed; alternatively, the second chip selection structure 600 and the first chip selection structure 500 may be disposed in parallel.

In the present embodiment, the third sub through electrode 610 of the second chip selection structure 600 is disposed adjacent to the first chip selection pad 510 of the first chip selection structure 500. The fourth sub through electrode 620 is disposed adjacent to the third sub through electrode 610.

In the present embodiment, the distance between the first chip selection pad 510 and third sub through electrode 610 and the distance between the third sub through electrode 610 and the fourth sub through electrode 620 are substantially the same.

The second main through electrode 630 is disposed adjacent to the fourth sub through electrode 620, the third main through electrode 640 is disposed adjacent to the second main through electrode 630, and the second chip selection pad 650 is disposed adjacent to the third main through electrode 640.

In the present embodiment, the distance between the fourth sub through electrode 620 and the second main through electrode 630, the distance between the second main through electrode 630 and the third main through electrode 640, and the distance between the third main through electrode 640 and the second chip selection pad 650 are substantially the same.

In the present embodiment, the second chip selection redistribution 660 electrically connects the second main through electrode 630, the third main through electrode 640, and the second chip selection pad 650.

Connection members 665 are respectively disposed at ends of the third sub through electrode 610, the fourth sub through electrode 620, the second main through electrode 630, and the third main through electrode 640 of the second chip selection structure 600. In the present embodiment, the connection member 665 may include a solder, or alternatively various other metals that have a low melting temperature.

Figure 7:
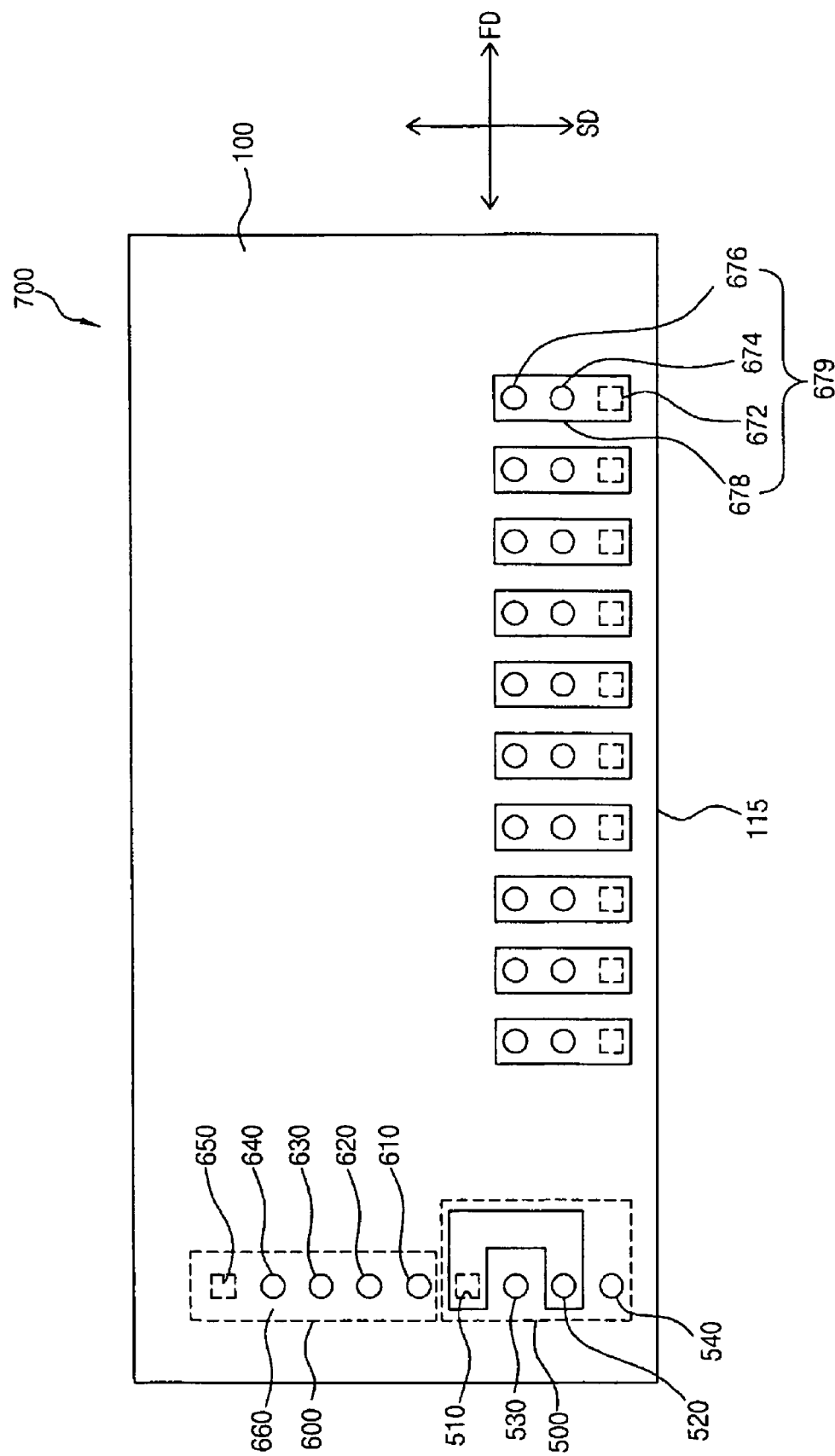
FIG. 7 is a plan view showing the data pad structure of the semiconductor chip shown in FIG. 5.

FIG. 7 is a plan view showing the data pad structure included in the semiconductor chip shown in FIG. 5.

Referring to FIG. 7, the semiconductor chip 700 includes a data pad structure 679 in addition to the semiconductor chip body 400 and the first and second chip selection structures 500 and 600. In the present embodiment, a plurality of the data pad structures 679 is disposed along the edge 415 of the first surface 410 of the semiconductor chip body 400.

Each data pad structure 679 includes a data pad 672, a first data through electrode 674, and a second data through electrode 676. In addition, the data pad structure 679 may include a data redistribution 678.

In the semiconductor chip 300, an address signal, a power signal, a data signal, and a control signal may be applied to the data pad 672 of the data pad structure 679.

In the present embodiment, the plurality of data pad structures 678 is disposed along the edge 415 of the first surface 410 of the semiconductor chip body 400.

Respective data pads 672 of the pad structures 679 are disposed along the edge 415 of the first surface 410 of the semiconductor chip body 400, and the data pad 672 is electrically connected to the circuit part.

The first data through electrode 674 is disposed at a predetermined distance from the data pad 672. The first data through electrode 674 passes through the first surface 410 and the second surface 420 of the semiconductor chip body 400. In the present embodiment, the distance between the data pad 672 and the first data through electrode 674 is substantially the same as the distance between the first main through electrode 520 and the second sub through electrode 540. A connection member 665, such as a solder, is disposed at an end of the first data through electrode 674, which is exposed from the first surface 410 of the semiconductor chip body 400. As alternatives to solder, various metals having a low melting temperature may be used as the connection member 665.

The second data through electrode 676 is disposed at a predetermined distance from the first data through electrode 674. The second data through electrode 676 passes through the first surface 410 and the second surface 420 of the semiconductor chip body 400. In the present embodiment, the distance between the first data through electrode 674 and the second data through electrode 676 is substantially the same as the distance between the first main through electrode 520 and the first sub through electrode 530. A connection member 665, such as a solder, is disposed at an end of the second data through electrode 676, which is exposed from the first surface 410 of the semiconductor chip body 400. As alternatives to solder, various metals having a low melting temperature may be used as the connection member 665.

In the present embodiment, the data pad structure 679, which includes the data pad 672, the first data through electrode 674, and the second data through electrode 676, is disposed parallel to the first chip selection structure 500.

Meanwhile, the data redistribution 678 is disposed over the first surface 410 of the semiconductor chip body 400. The data redistribution 678 electrically connects the data pad 672, the first data through electrode 674, and the second data through electrode 676. Examples of material suitable for the data redistribution 678 include copper and the like.

The semiconductor chip described in detail with reference to FIGS. 5 through 7 can be applied to various stacked semiconductor packages in which at least two semiconductor chips are stacked on each other.

Figure 8:
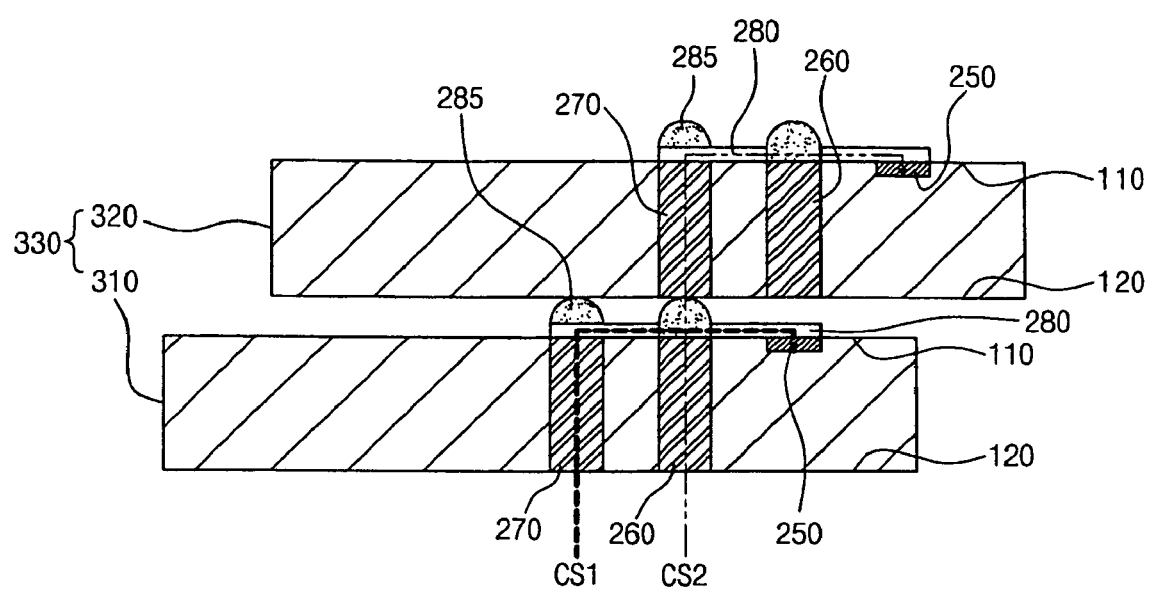
FIG. 8 is a cross-sectional view showing a stacked semiconductor package in accordance with an embodiment of the present invention.

FIG. 8 is a cross-sectional view showing a stacked semiconductor package in accordance with an embodiment of the present invention.

Referring to FIG. 8, a stacked semiconductor package 330 includes, e.g., a first semiconductor chip 310 and a second semiconductor chip 320. In the present embodiment, the first semiconductor chip 310 and the second semiconductor chip 320 have substantially the same structure.

Each of the first and second semiconductor chips 310 and 320 shown in FIG. 8 has substantially the same structure as that of the semiconductor chip 300 shown in FIG. 3. Therefore, a duplicate description of the first and second semiconductor chips 310 and 320 which form the stacked semiconductor package 330 will be omitted, and the same names and reference numerals of elements of the semiconductor chip shown in FIG. 3 will be given to the same elements in FIG. 8.

Referring to FIGS. 3 and 8, in order to apply an address signal, a data signal, a power signal, and a control signal to the data pad structure 290 of the first semiconductor chip 310 or the data pad structure 290 of the second semiconductor chip 320, the chip selection structure 200 of the first semiconductor chip 310 and a chip selection structure 200 of the second semiconductor chip 320 are electrically connected; and the data pad structure 290 of the first semiconductor chip 310 and the data pad structure 290 of the second semiconductor chip 320 are also electrically connected.

To this end, the first semiconductor chip 310 and the second semiconductor chip 320 are disposed such that they offset each other, and thus a connection member 285 disposed on a sub through electrode 260 of the first semiconductor chip 310 is electrically connected to a main through electrode 270 of the second semiconductor chip 320.

When a first chip selection signal CS1 is applied to the main through electrode 270 of the first semiconductor chip 310, the first chip selection signal CS1 is applied to the chip selection pad 250 of the first semiconductor chip 310 through the chip selection redistribution 280 of the first semiconductor chip 310.

Additionally, a second chip selection signal CS2 is applied to the sub through electrode 260 of the first semiconductor chip 310. The second chip selection signal CS2 is then applied to the chip selection pad 250 of the second semiconductor chip 320 through the main through electrode 270 and the chip selection redistribution 270 of the second semiconductor chip 320.

Figure 9:
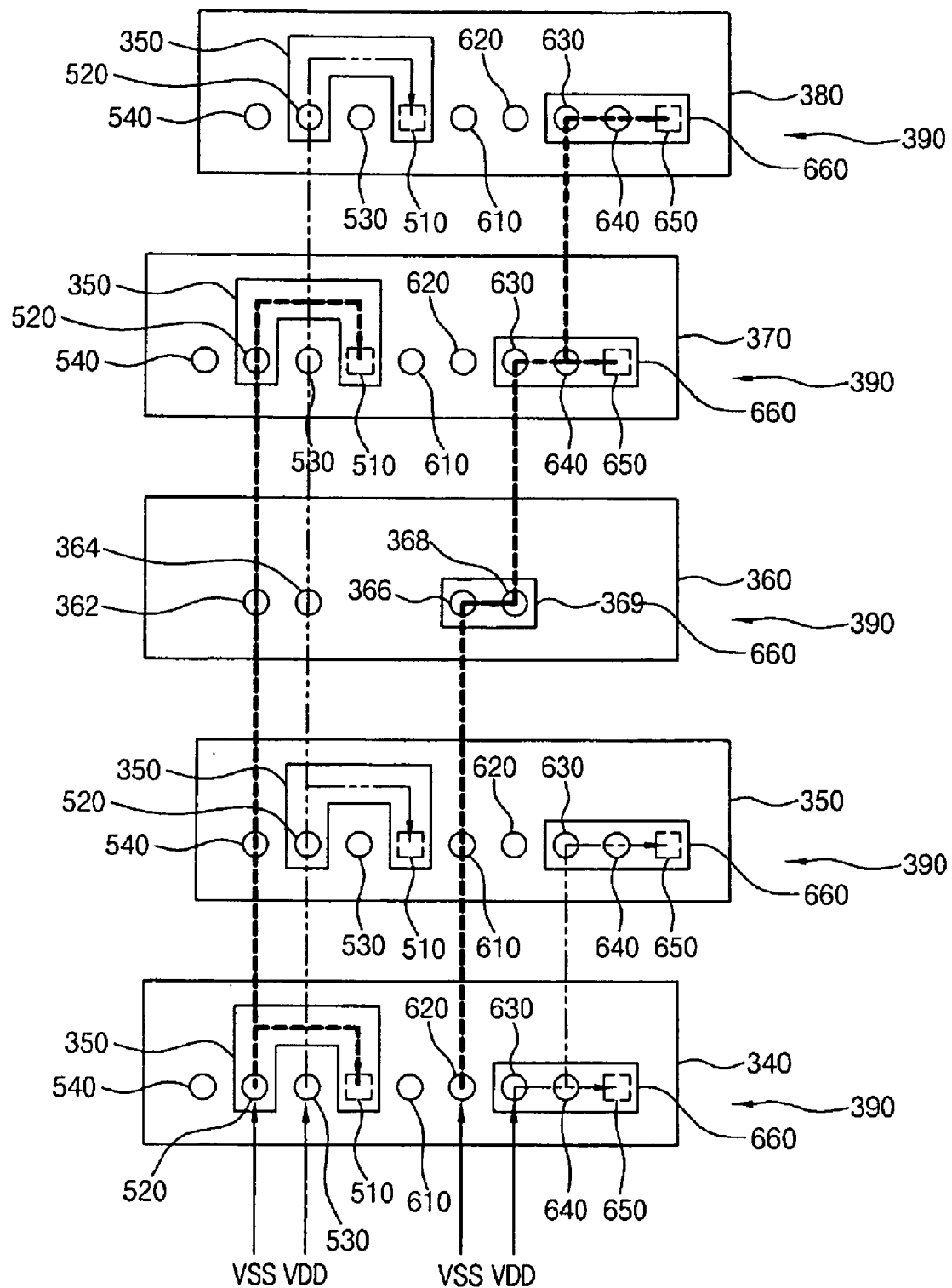
FIG. 9 is a schematic view showing a stacked semiconductor package in accordance with another embodiment of the present invention.

FIG. 9 is a schematic view illustrating a stacked semiconductor package in accordance with another embodiment of the present invention.

Referring to FIG. 9, a stacked semiconductor package 390 includes, e.g., a first semiconductor chip 340, a second semiconductor chip 350, a third semiconductor chip 370, and a fourth semiconductor chip 380. The first through fourth semiconductor chips 340, 350, 370 and 380 are shown in a plan view in FIG. 9 simply for explanation purposes. The first through fourth semiconductor chips 340, 350, 370, and 380 are actually stacked on one another.

In the present embodiment, the second semiconductor chip 350 is disposed over the first semiconductor chip 340, the third semiconductor chip 370 is disposed over the second semiconductor chip 350, and the fourth semiconductor chip 380 is disposed over the third semiconductor chip 370.

The reference numeral 360 may be a dummy semiconductor chip or a dummy PCB, with the dummy semiconductor chip 360 being interposed between the second semiconductor chip 350 and the third semiconductor chip 370.

Each of the first through fourth semiconductor chips 340, 350, 370, and 380 shown in FIG. 9 has substantially the same structure as the semiconductor chip 700 shown in FIG. 7. Therefore, a duplicate description of the first to fourth semiconductor chips 340, 350, 370 and 380 which form the stacked semiconductor package 390 will be omitted; and the same names and reference numerals given to elements of the semiconductor chip shown in FIG. 7 will be given to the same elements in FIG. 9.

The first semiconductor chip 340 and the second semiconductor chip 350 are disposed such that they offset, and thus the first main through electrode 520 of the first semiconductor chip 340 is electrically connected to the second sub through electrode 540 of the second semiconductor chip 350.

The first sub through electrode 530 of the first semiconductor chip 340 is electrically connected to the first main through electrode 520 of the second semiconductor chip 350.

The fourth sub through electrode 620 of the first semiconductor chip 340 is electrically connected to the third sub through electrode 610 of the second semiconductor chip 350.

The second and third main through electrode 630 and 640 of the first semiconductor chip 340 are electrically connected to the second and third main through electrode 630 and 640 of the second semiconductor chip 350.

The third semiconductor chip 370 and the fourth semiconductor chip 380 are disposed such that they offset each other, and thus the first main through electrode 520 of the third semiconductor chip 370 is electrically connected to the second sub through electrode 540 of the fourth semiconductor chip 380.

The first sub through electrode 530 of the third semiconductor chip 370 is electrically connected to the first main through electrode 520 of the fourth semiconductor chip 380.

The fourth sub through electrode 620 of the third semiconductor chip 370 is electrically connected to the third sub through electrode 610 of the fourth semiconductor chip 380.

The second and third main through electrodes 630 and 640 of the third semiconductor chip 370 are electrically connected to the second and third main through electrodes 630 and 640 of the fourth semiconductor chip 380.

The dummy semiconductor chip 360, which is interposed between the second semiconductor chip 350 and the third semiconductor chip 370, has four through electrodes. Hereinafter, the four through electrodes disposed in the dummy semiconductor chip 360 will be referred to as a first through electrode 362, a second through electrode 364, a third through electrode 366, and a fourth through electrode 368. In addition, the dummy semiconductor chip 360 further includes a redistribution which electrically connects the third and fourth through electrodes 366 and 368.

The first through electrode 362 electrically connects the second sub through electrode 540 of the second semiconductor chip 350 to the first main through electrode 520 of the third semiconductor chip 370.

The second through electrode 364 electrically connects the first main through electrode 520 of the second semiconductor chip 350 to the first sub through electrode 530 of the third semiconductor chip 370.

The third through electrode 366 is electrically connected to the third sub through electrode 610 of the second semiconductor chip 350, and the fourth through electrode 368 is electrically connected to the second main through electrode 640 of the third semiconductor 370. The third through electrode 366 and the fourth through electrode 368 are electrically connected by the redistribution 369.

In the present embodiment, a ground signal Vss is applied to the first main through electrode 520 of the first semiconductor chip 340, and a power signal Vdd is applied to the first sub through electrode 530 of the first semiconductor chip 340. The ground signal Vss is applied to the fourth sub through electrode 620 of the first semiconductor chip 340, and the power signal Vdd is applied to the second main through electrode 630 of the first semiconductor chip 340.

Table 1 below shows each chip selection signal combination for selecting the respective one of the four semiconductor chips.

|  | First semiconductor chip | Second semiconductor chip | Third semiconductor chip | Fourth semiconductor chip |
|---|---|---|---|---|
| First chip selection pad | Vss | Vdd | Vss | Vdd |
| Second chip selection pad | Vdd | Vdd | Vss | Vss |

Referring to Table 1, in order to select the first semiconductor chip 340, the ground signal Vss is applied to the first chip selection pad 510 of the first semiconductor chip 340 through the first main through electrode 520 of the first semiconductor chip 340. In addition, the power signal Vdd is applied to the second chip selection pad 650 through the second main through electrode 630 of the first semiconductor chip 340.

In order to select the second semiconductor chip 350, the power signal Vdd is applied to the first chip selection pad 510 of the second semiconductor chip 350 through the first sub through electrode 530 of the first semiconductor chip 340. In addition, the power signal Vdd is applied to the second chip selection pad 650 of the second semiconductor chip 350 through the second and third main through electrodes 630 and 640 of the first semiconductor chip 340.

In order to select the third semiconductor chip 370, the ground signal Vss is applied to the first chip selection pad 510 of the third semiconductor chip 370 through the first main through electrode 520 of the third semiconductor chip 370. That is, the ground signal Vss is applied to the first main through electrode 520 of the first semiconductor chip, which is electrically connected to the first main through electrode of the third semiconductor chip 370. In addition, the ground signal Vss is applied to the second chip selection pad 650 of the third semiconductor chip 370 through the second and third main through electrodes 630 and 640 of the third semiconductor chip 370. That is, the ground signal Vss is applied to the fourth sub through electrode 620 of the first semiconductor chip 340, which is electrically connected to the second and third main through electrodes 630 and 640 of the third semiconductor chip.

In order to select the fourth semiconductor chip 380, the power signal Vdd is applied to the first chip selection pad 510 of the fourth semiconductor chip 380 through the first main through electrode 520 of the fourth semiconductor chip 380. That is, the power signal Vdd is applied to the first sub through electrode 530 of the first semiconductor chip 340, which is electrically connected to the first main through electrode 520 of the fourth semiconductor chip 380. In addition, the ground signal Vss is applied to the second chip selection pad 650 of the fourth semiconductor chip 380 through the second and third main through electrodes 630 and 640 of the fourth semiconductor chip 380. That is, the ground signal Vss is applied to the fourth sub through electrode 620 of the first semiconductor chip 340, which is electrical connected to the second and third main through electrodes 630 and 640 of the fourth semiconductor chip 380.

As is apparent from the above description, in the present invention, it is possible to realize a stacked semiconductor package by stacking a plurality of semiconductor chips having a chip selection structure of the same shape such that the stacked semiconductor chips offset.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A semiconductor chip having a semiconductor chip body, the semiconductor chip comprising:
    a chip selection structure comprising:
        a chip selection pad disposed on the semiconductor chip body;
        a main through electrode electrically connected to the chip selection pad; and
        a sub through electrode disposed adjacent to the chip selection pad and electrically disconnected from the chip selection pad.

2. The semiconductor chip according to claim 1, wherein the sub through electrode is interposed between the main through electrode and the chip selection pad.

3. The semiconductor chip according to claim 1, wherein the chip selection pad, the sub through electrode, and the main through electrode are disposed in a substantially straight line when viewed from the top of the semiconductor chip.

4. The semiconductor chip according to claim 1, wherein the chip selection pad is disposed adjacent to an edge of the semiconductor chip body, and the chip selection pad, the sub through electrode, and the main through electrode are aligned in a direction substantially perpendicular to the edge.

5. The semiconductor chip according to claim 1, further comprising connection members disposed at an end of the main through electrode and an end of the sub through electrode.

6. The semiconductor chip according to claim 2, wherein the chip selection pad and the main through electrode are electrically connected to each other by a chip selection redistribution disposed over the semiconductor chip body.

7. The semiconductor chip according to claim 1, wherein the main through electrode passes through the chip selection pad such that the main through electrode and the chip selection pad are electrically connected.

8. The semiconductor chip according to claim 1, further comprising:
a data pad structure disposed along an edge of the semiconductor chip body, the data pad structure comprising:
a data pad;
a first data through electrode electrically connected to the data pad; and
a second data through electrode electrically connected to the first data through electrode.

9. The semiconductor chip according to claim 8, wherein the first data through electrode passes through the data pad.

10. The semiconductor chip according to claim 8, wherein the data pad structure is disposed parallel to the chip selection structure.

11. The semiconductor chip according to claim 8, wherein:
the data pad, the first data through electrode, and the second data through electrode are aligned in a direction substantially perpendicular to the edge,
the chip selection pad, the sub through electrode, and the main through electrode are aligned in a direction substantially perpendicular to the edge, and
a distance between the main through electrode and the sub through electrode is substantially the same as a distance between the first data through electrode and the second data through electrode.

12. The semiconductor chip according to claim 8, further comprising connection members disposed at an end of the first data through electrode and an end of the second data through electrode.

13. The semiconductor chip according to claim 8, wherein the data pad, the first data through electrode, and the second data through electrode are electrically connected to each other by a data redistribution disposed over the semiconductor chip body.

14. A semiconductor chip having a semiconductor chip body, the semiconductor chip comprising:
a first chip selection structure comprising:
a first chip selection pad disposed on the semiconductor chip body;
a first main through electrode electrically connected to the first chip selection pad;
a first sub through electrode interposed between the first main through electrode and the first chip selection pad; and
a second sub through electrode disposed outside of the first main through electrode; and
a second chip selection structure comprising:
a third sub through electrode and a fourth sub through electrode disposed adjacent to the first chip selection pad;
a second main through electrode and a third main through electrode disposed outside of the third and fourth sub through electrodes; and
a second chip selection pad disposed outside of the second and third main through electrodes and electrically connected to the second and third main through electrodes.

15. The semiconductor chip according to claim 14, wherein a distance between the first main through electrode and the first sub through electrode, and a distance between the first main through electrode and the second sub through electrode are substantially the same as a distance between the second main through electrode and the third main through electrode, a distance between the second main through electrode and the fourth sub through electrode, and a distance between the third sub through electrode and the fourth sub through electrode.

16. The semiconductor chip according to claim 14, wherein the first chip selection structure and the second chip selection chip structure are disposed parallel to each other.

17. The semiconductor chip according to claim 14, wherein the first chip selection structure and the second chip selection chip structure are aligned perpendicularly with respect to an edge of the semiconductor chip body.

18. The semiconductor chip according to claim 14, further comprising a first chip selection redistribution for electrically connecting the first chip selection pad to the first main through electrode.

19. The semiconductor chip according to claim 14, further comprising a second chip selection redistribution for electrically connecting the second chip selection pad to the second and third main through electrodes.

20. The semiconductor chip according to claim 14, further comprising connection members disposed at an end of each of the first main through electrode, the first and second sub through electrodes, the second and third main through electrodes, and the third and fourth sub through electrodes.

21. The semiconductor chip according to claim 14, further comprising a data pad structure disposed over the semiconductor chip body, the data pad structure comprising a data pad, a first data through electrode electrically connected to the data pad, and a second data through electrode electrically connected to the first data through electrode.

22. A stacked semiconductor package, comprising
a first semiconductor chip having a first semiconductor chip body, the first semiconductor chip comprising:
a first chip selection pad disposed on the first semiconductor chip body;
a first main through electrode electrically connected to the first chip selection pad; and
a first sub through electrode disposed adjacent to the first chip selection pad; and
a second semiconductor chip having a second semiconductor chip, the second semiconductor chip body comprising:
a second chip selection pad disposed over the second semiconductor chip body;
a second main through electrode electrically connected to the second chip selection pad; and a second sub through electrode disposed adjacent to the second chip selection pad;

wherein the second semiconductor chip is disposed over the first semiconductor chip, and the first and second semiconductor chips are disposed such that they offset each other and the first sub through electrode is electrically connected to the second main through electrode.

23. The stacked semiconductor package according to claim 22, further comprising a connection member for electrically connecting the first sub through electrode to the second main through electrode.

* * * * *